United States Patent
McElheny et al.

(10) Patent No.: US 7,514,758 B2
(45) Date of Patent: *Apr. 7, 2009

(54) DUAL-OXIDE TRANSISTORS FOR THE IMPROVEMENT OF RELIABILITY AND OFF-STATE LEAKAGE

(75) Inventors: Peter John McElheny, Morgan Hill, CA (US); Yowjuang (Bill) Liu, San Jose, CA (US)

(73) Assignee: Altera Corporation, San Jose, CA (US)

( * ) Notice: Subject to any disclaimer, the term of this patent is extended or adjusted under 35 U.S.C. 154(b) by 63 days.

This patent is subject to a terminal disclaimer.

(21) Appl. No.: 11/149,049

(22) Filed: Jun. 8, 2005

(65) Prior Publication Data

US 2005/0224840 A1    Oct. 13, 2005

Related U.S. Application Data

(60) Continuation of application No. 10/800,221, filed on Mar. 11, 2004, now Pat. No. 6,951,792, which is a division of application No. 10/189,920, filed on Jul. 3, 2002, now Pat. No. 6,740,944.

(60) Provisional application No. 60/303,334, filed on Jul. 5, 2001.

(51) Int. Cl.
*H01L 27/088* (2006.01)
(52) U.S. Cl. .................. 257/411; 257/336; 257/345; 257/401; 257/E21.193
(58) Field of Classification Search ........... 438/286; 257/174, 336, 411, 327, 345, 401, E21.193
See application file for complete search history.

(56) References Cited

U.S. PATENT DOCUMENTS

| | | | | |
|---|---|---|---|---|
| 5,451,799 | A * | 9/1995 | Kurimoto et al. | 257/174 |
| 5,610,430 | A * | 3/1997 | Yamashita et al. | 257/412 |
| 6,057,582 | A * | 5/2000 | Choi | 257/411 |
| 6,225,669 | B1 * | 5/2001 | Long et al. | 257/411 |
| 6,740,944 | B1 * | 5/2004 | McElheny et al. | 257/411 |
| 6,794,709 | B2 * | 9/2004 | Ahn et al. | 257/315 |

* cited by examiner

*Primary Examiner*—Howard Weiss
*Assistant Examiner*—John C Ingham
(74) *Attorney, Agent, or Firm*—Ward & Olivo

(57) ABSTRACT

The invention provides a transistor having low leakage currents and methods of fabricating the transistor on a semiconductor substrate. The transistor has a gate and a nonuniform gate oxide under the gate.

13 Claims, 5 Drawing Sheets

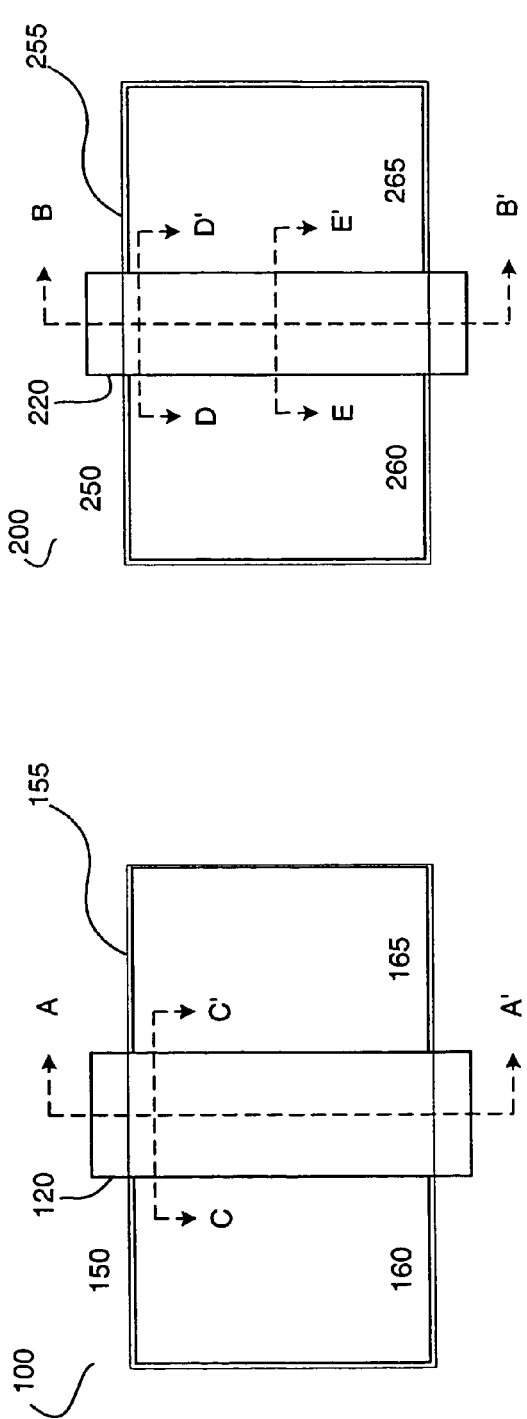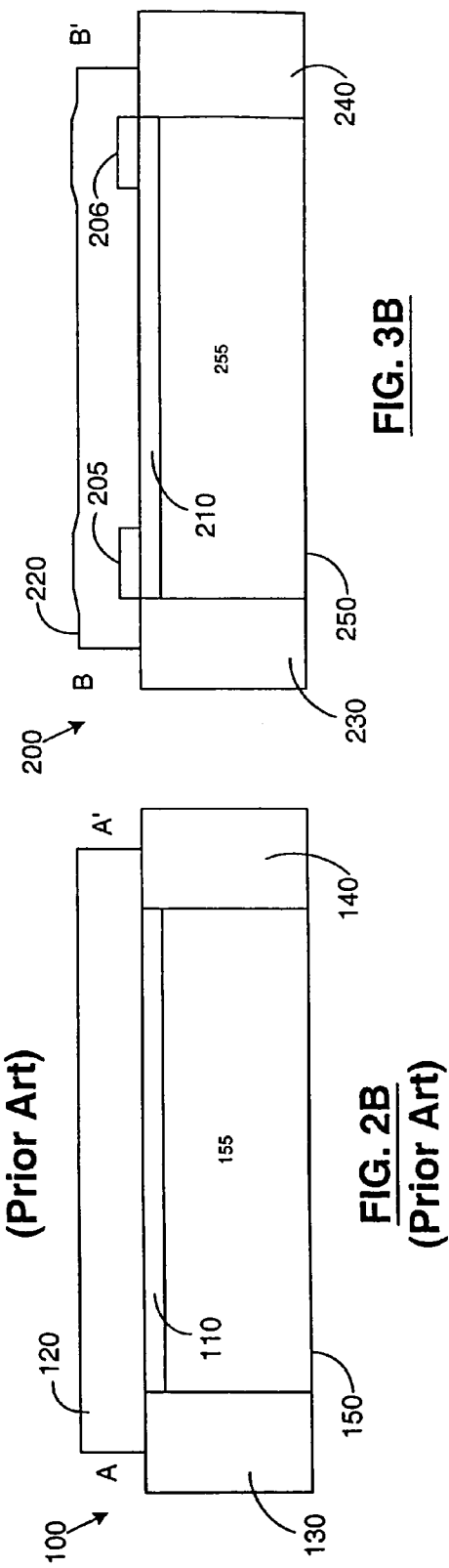

DUAL-OXIDE TRANSISTORS FOR THE IMPROVEMENT OF RELIABILITY AND OFF-STATE LEAKAGE

CROSS REFERENCE TO RELATED APPLICATIONS

This application is a continuation of application Ser. No. 10/800,221, filed Mar. 11, 2004, now U.S. Pat. No. 6,951,792 which is a divisional of application Ser. No. 10/189,920, filed Jul. 3, 2002, now U.S. Pat. No. 6,740,944 which claims priority to provisional application No. 60/303,334, filed Jul. 5, 2001. These applications are incorporated herein by reference.

FIELD OF THE INVENTION

The present invention relates to semiconductor devices, and more particularly, to a design of semiconductor devices, such as metal oxide semiconductor field effect transistors (MOSFETs), which have reduced leakage currents, and to a method for fabricating the same.

BACKGROUND OF THE INVENTION

FIG. 1A depicts a partial top view of a conventional MOSFET device 10. As shown in FIG. 1A, MOSFET device has a gate 12 over a substrate 22. A source region 14 and a drain region 16 are located in substrate 22 on opposite sides of gate 12. Gate 12 referred to as having a length L that extends in the y direction and a width W that extends in the z direction, shown in FIG. 1A. Consistent with that usage, the dimension of a MOSFET gate, such as gate 12, in the z direction, will hereafter be referred to as its width, and a reference to the ends of the gate will be understood to refer to opposite ends of the gate in the z direction.

FIG. 1B is a cross-sectional schematic view of the MOSFET device 10. As shown in FIG. 1B, source 14 and drain 16 are formed in a well region 20 in substrate 22. Gate 12 is separated from substrate 22 and thus source 14 and drain 16 by an oxide layer 15. The thickness of oxide layer 15 and the degree of any overlap of the gate over the source and the drain regions can vary. Device 10 may also have dielectric spacers 50 and 55 on two sides of gate 12, and lightly doped drain (LDD) regions 40 and 42 adjacent source and drain regions 14 and 16, respectively. Spacers 50 and 55 help to further isolate gate 12 from source 14 and drain 16 to prevent the build up of device capacitance. Device 10 may be isolated from other devices also formed on substrate 22 by dielectric trenches (not shown) at some or all sides of device 10.

Source and drain regions 14 and 16 in substrate 22 are typically regions doped with dopants of a same conductivity type. Well region 20 is typically doped with dopants of a different conductivity type from that in the source and drain regions. LDD regions 40 and 42 are typically doped with dopants of the same conductivity type as in the source and drain regions, but dopant concentrations in the LDD regions are typically much lighter than in the source and drain regions.

A MOSFET device, such as device 10, behaves like a switch: when it is "on", i.e., when a sufficient threshold voltage, $V_t$, is applied to the gate, a channel 18 is formed in a region immediately under oxide layer 15 and relatively large currents flow through the channel between the source and drain. Ideally, when the MOSFET 10 is "off", there is no current flow. In practice, however, there is typically a small amount of unwanted leakage current when device 10 is off. Assuming that $I_{on}$ is the current that flows between the source and drain of a MOSFET device in the "on" state, and $I_{off}$ is the small amount of unwanted leakage current that flows or "leaks" between any two of the source, drain and gate in an off-state of the device, the on/off ratio ($I_{on}/I_{off}$) of a transistor is a common figure of merit and benchmark for transistor performance comparisons. Higher $I_{off}$ values result in lower on/off ratios, and indicate degraded transistor performance.

There are several causes of off-state leakage currents. Parasitic leakage paths between the gate and channel, commonly referred to as sidewall leakage, can result in excessive forward and reverse gate leakage currents. For example, leakage can occur where the gate overlaps or is closely adjacent the drain and the source (commonly referred to as edge conduction leakage). Devices which exhibit high edge conduction and sidewall leakage are characterized by degraded device performance, such as increased off-state power dissipation.

Leakage currents can also result from other sources within a semiconductor device or as a consequence of various device processing steps. For example, in practice processing steps associated with the formation of shallow trench isolation (STI) may result in electrons being trapped near a substrate-nitride interface, inducing sidewall leakage between an isolating trench and a device.

Leakage currents can also occur due to inverse narrow width effect (INWE). INWE is a parasitic phenomenon which lowers the effective threshold voltage as the length of the gate becomes smaller. Device performance, reliability, layout efficiency and yield are known to be degraded by the inverse narrow width effect. The lower threshold voltage, $V_t$, means higher off-state leakage currents that increase overall power consumption, result in excess heat generation and can cause problems related to the dissipation of excess heat.

Another design and manufacturing concern relates to gate oxide thinning. Gate oxide thinning occurs over the device lifetime due to stresses on the device such as high applied voltage levels, temperature and imperfections in the oxide layer. The phenomenon of the thinning of the gate oxide film increases the likelihood of dielectric breakdown which can adversely affect the operating characteristics of devices. Moreover, the well-known "hot-carrier effect" can cause damage to the oxide layer by increasing the chances of oxide breakdown, particularly at oxide edges.

As device geometries continue to shrink and threshold voltages continue to scale down, leakage currents have an even greater impact on device performance. Particularly in low power or high temperature applications, leakage currents can represent a significant source of device degradation and performance impairment. The problem of leakage currents is exacerbated by the existence of numerous possible causes of such currents. To resolve the problem requires complex failure identification and analysis. Such failure analysis projects are costly and highly dependent upon the skills and resourcefulness of the individuals conducting the failure analysis. Therefore, a need exists for a device design and fabrication approach that can compensate for manufacturing defects, device degradation or tolerance failures due to leakage currents.

BRIEF SUMMARY OF THE INVENTION

The present invention provides a design of a MOS transistor with reduced leakage current and without adverse device performance that typically accompanies other prior art approaches.

In one embodiment of the present invention, a MOSFET has a thicker gate oxide at one or more ends of the gate, thereby minimizing leakage currents without adversely impacting overall device $V_t$ as would occur if the gate oxide were made uniformly thicker.

The present invention also includes a method for fabricating a MOS transistor where the gate oxide is thicker at the ends of the gate for the purposes of reducing off-state leakage, increasing reliability and enhancing overall device performance. In one embodiment of the present invention, the MOS transistor is fabricated on a semiconductor substrate together with other devices in an integrated circuit (IC), using conventional IC fabrication steps. With some modification of one or more masks in the conventional IC processing steps, a non-uniform gate oxide is created that is thicker near the ends of the conducting channel of MOS transistor. Therefore, the present invention provides a MOS transistor with reduced leakage currents, and does not require additional complicated manufacturing steps for making the MOS transistor.

BRIEF DESCRIPTION OF THE DRAWINGS

For a more complete understanding of the present invention and advantages thereof, reference is now made to the following description taken in conjunction with the accompanying drawings:

FIGS. 2A-2D are block diagrams illustrating in top view and vertical cross sections a conventional MOS transistor;

FIGS. 3A-3D are block diagrams illustrating in top view and vertical cross sections a MOS transistor according to one embodiment of the present invention;

DETAILED DESCRIPTION OF THE INVENTION

Figure 1A:
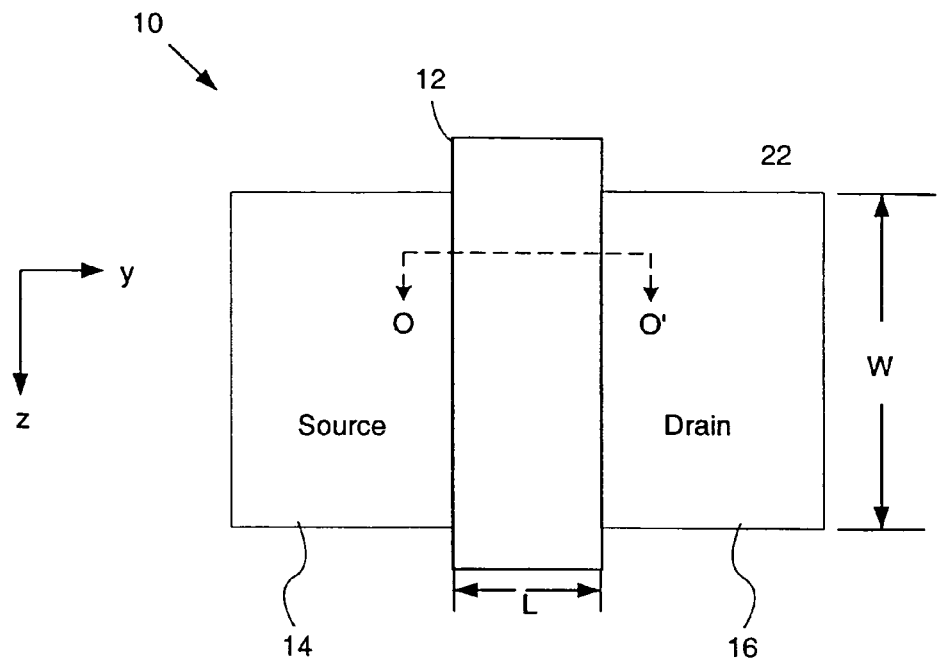
FIGS. 1A-1B are block diagrams illustrating views of a prior art MOSFET device.
Figure 1B:
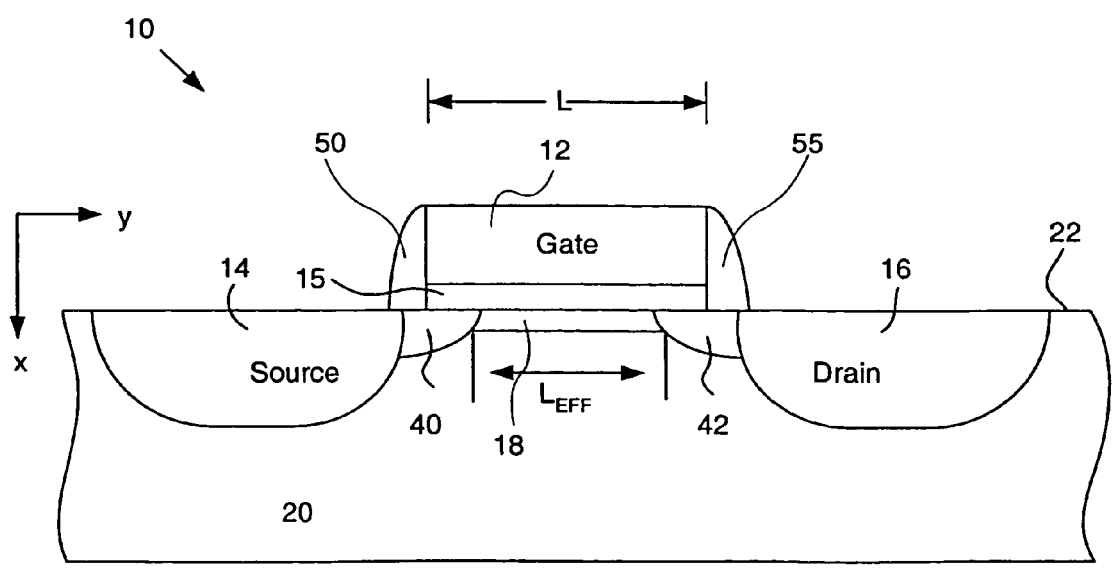
Figure 2C:
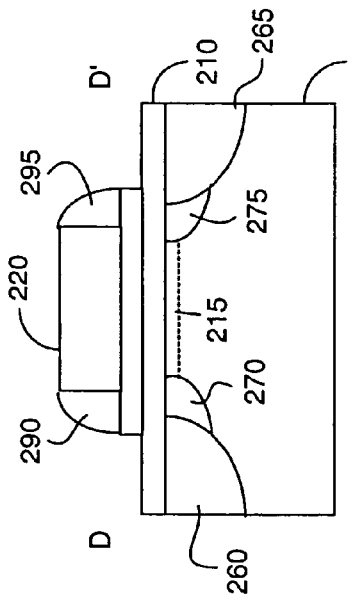

The figures referred to hereafter are for illustrative purposes and are not to scale or to conform in shape with real devices. FIGS. 2A-D depict a conventional MOSFET device 100. Referring to FIG. 2A, which shows a top view of device 100, device 100 comprises a gate 120 between two diffusion regions, i.e., source 160 and drain 165, in an active region 155 in a semiconductor (such as silicon) substrate 150. Gate 120 is typically formed of polysilicon or metal. Source 160 and drain 165 can be either p-type or n-type diffusion regions in substrate 150.

FIG. 2B depicts device 100 in vertical cross-section along lines A-A' in FIG. 2A. As shown in FIG. 2B, gate 120 is on top of a gate oxide layer 110 that is formed on the substrate 150. Regions 130 and 140 represent isolation regions created, for example, by shallow trench isolation (STI) manufacturing techniques.

FIG. 2C depicts device 100 in vertical cross-section along lines C-C' in FIG. 2A. As shown in FIG. 2C, device 100 further comprises spacers 190 and 195 on the two sides of gate 120, and two LDD regions 170 and 175 under gate oxide 110 and adjacent source 160 and drain 165, respectively. The LDD regions 170 and 175 are typically diffusion regions having the same conductivity type as the source and drain regions 160 and 165, but are shallower than the source and drain regions 160 and 165 and have lower dopant concentrations than those in the source and drain regions 160 and 165. Spacers 190 and 195 are typically made of one or more layers of dielectric materials.

Figure 2D:
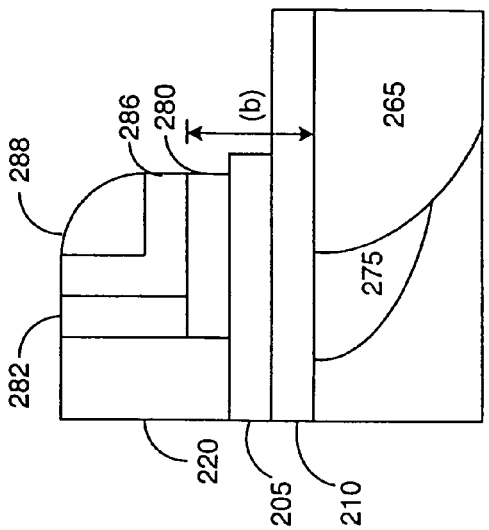

FIG. 2D depicts in vertical cross-section an example of spacer 195 along an edge of gate 120. As shown in FIG. 2D, spacer 195 comprises an oxide layer 180 formed on a portion of gate oxide layer 110, and an oxide spacer 182 formed on a sidewall of gate 120. The thickness of gate oxide layer 110 is generally uniform over the device and may vary from device to device. As an example, the thickness of gate oxide layer 110 is about 30 angstroms and the combined thickness (a) of oxide layer 180 and oxide layer 110 is about 150 angstroms. Spacer 195 further comprises a nitride spacer layer 186 upon layer 180 and separated from the gate 120 by oxide spacer 182. Another oxide spacer layer 188 is upon the nitride layer 186.

Prior art device 100 has several problems. First, the uniform gate oxide film 110 is generally weakest at edges closest to the ends of gate 120, i.e., the parts of the gate near isolation regions 130 and 140. Second, as the effective thickness of the initially uniform gate oxide film near the ends of the gate becomes thinner due to edge effects (e.g., the "hot-carrier effect"), device 100 will degrade due to the inverse narrow width effect in which the threshold voltage decreases as the width of the gate is reduced. Additionally since source (or drain) region 160 or 165 is typically heavily doped, there exists a fringing capacitance between the gate and the source (or drain), adversely affecting device speed.

Figure 3C:
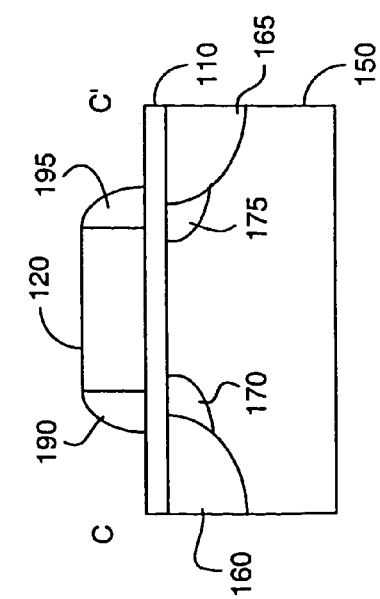

The present invention overcomes the above disadvantages of the prior art device by providing a MOS transistor with a gate oxide layer that is thicker near the ends of the gate of the MOS transistor. FIGS. 3A-3D depict a MOS transistor device 200 according to one embodiment of the present invention. As shown in FIG. 3A, device 200 comprises a gate 220 and two diffusion regions, source 260 and drain 265 on opposite sides of gate 220. Gate 220 is typically formed of polysilicon or metal. Source 260 and drain 265 can be either p-type or n-type diffusion regions in an active region 255 in a semiconductor (such as silicon) substrate 250.

FIG. 3B depicts device 200 in vertical cross-section along line B-B' in FIG. 3A. As depicted, device 200 comprises an oxide layer 210 and added oxide layers 205 and 206 near the ends of gate 220. Oxide layers 210, 205 and 206 form a composite gate oxide layer that is thicker near the ends of gate 220. The portion of the composite gate oxide layer near the middle of gate 120 has a uniform thickness of, for example, about 30 angstrom. Regions 230 and 240 represent isolation regions created, for example, by STI manufacturing techniques. When a threshold voltage $V_t$ is applied to gate 220, a conductive channel 215 is formed (or turned on) underneath oxide layer 210 and electric current may flow through channel 215 between source 260 and drain 265.

FIG. 3C depicts device 200 in vertical cross-section along line D-D' in FIG. 3A. As shown in FIG. 3C, device 200 may further comprise spacers 290 and 295 on the two sides of gate 220, and two LDD regions 270 and 275 under the composite gate oxide layer and adjacent source 260 and drain 265, respectively. The LDD regions 270 and 275 are typically diffusion regions having the same conductivity type as the source and drain regions 260 and 265, but are shallower than the source and drain regions 260 and 265 and have lower dopant concentrations than those in the source and drain regions 260 and 265. Spacers 290 and 295 are typically made of one or more dielectric materials. Unlike gate oxide layer 110, the composite gate oxide layer is not uniform over the device but is thicker near the ends of gate 220.

Figure 3D:
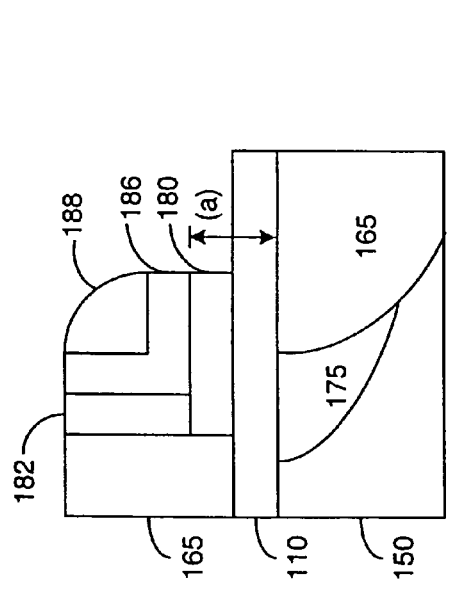

FIG. 3D illustrates in vertical cross-section an example of spacer 295 along an edge of gate 220 and on top of the composite gate oxide layer that includes layers 205, 206 and 210. As shown in FIG. 3D, spacer 295 comprises an oxide layer 280 formed on a portion of the composite gate oxide layer, and an oxide spacer 282 formed on a sidewall of gate 220. Spacer 295 further comprises a nitride spacer layer 286 upon layer 280 and separated from the gate 220 by oxide spacer 282. Another oxide spacer layer 288 is upon the nitride layer 286. For comparison, while the thickness of oxide layer 110 may be around 30 Angstroms, the thickness of the composite oxide layer near the ends of gate 220 can be around 70 Angstroms. Thus, if the dimension "a" in FIG. 2D was around its typical value of 150 Angstroms, the corresponding dimension "b" in FIG. 3D would be around 200 Angstroms.

The added thickness of the composite gate oxide layer due to oxide layers 205 and 206 provides several benefits. The thicker oxide increases the distance between the gate and source or drain near the ends of the gate, resulting in lower fringe capacitance and thus higher device speed. Also, since the leakage currents are generally strongest at the ends of a device channel (i.e., the parts of the channel near the ends of the gate), the thicker gate oxide near the ends of the gate helps to minimize leakage currents without adversely impacting threshold voltage of the device as would occur if the gate oxide were made uniformly thicker. The added thickness near the ends of gate 220 only leads to a higher $V_t$ for turning on portions of the channel near the ends of the gate where leakage effects are strongest. The resulting higher $V_t$ at the ends of the active region (i.e., portions of the active region near the ends of gate 220) reduces the energy of any hot electrons produced there, and thereby enhances the reliability of this weakest region (i.e., near ends of the active region).

Figure 3E:
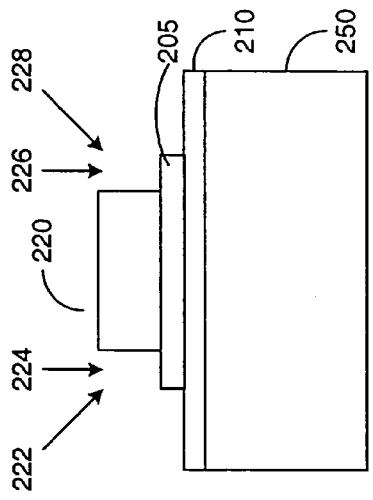
FIG. 3E is a block diagram illustrating directions of LDD implants for fabricating the MOS transistor according to one embodiment of the present invention.
Figure 2E:
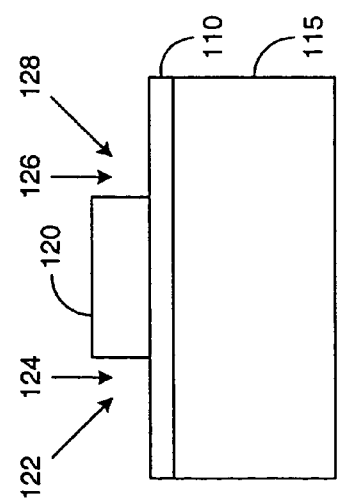
FIG. 2E is a block diagram illustrating directions of LDD implants for fabricating a conventional MOS transistor.

Further, the added gate oxide thickness near the ends of gate 220 also helps to attenuate ion implants, such as the LDD or source/drain implants, directed toward that region. FIG. 2E illustrates directions 122, 124, 126 and 128 of LDD implants for fabricating prior art MOS transistor 100. FIG. 3E illustrates directions 222, 224, 226 and 228 of LDD implants for fabricating MOS transistor 200 according to one embodiment of the present invention. During the fabrication of MOS transistor 200, any implants directed along a direction defined by arrows 222, 224, 226 or 228 in FIG. 3E are partially blocked (or "attenuated") by the thicker gate oxide near the ends of gate 220. As a result, the implants would not be completely and directly implanted into the substrate layer 250 near the ends of gate 220. The higher local $V_t$ as well as any blocked or partially blocked implants can compensate or offset the inverse narrow width effects, leading to lower off-state leakage currents.

Further, inverse narrow width effects are sometimes caused by leakage paths. But the increased thickness created by the composite gate oxide layer and the altered doping profile near ends of gate 220 increase the resistance of leakage paths there, and result in lower leakage currents.

Figure 3F:
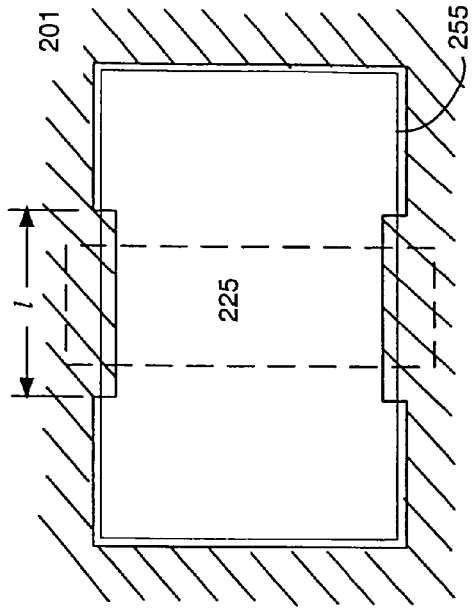
FIG. 3F is a block diagram illustrating a mask used during fabrication of the MOS transistor according to one embodiment of the present invention.
Figure 2F:
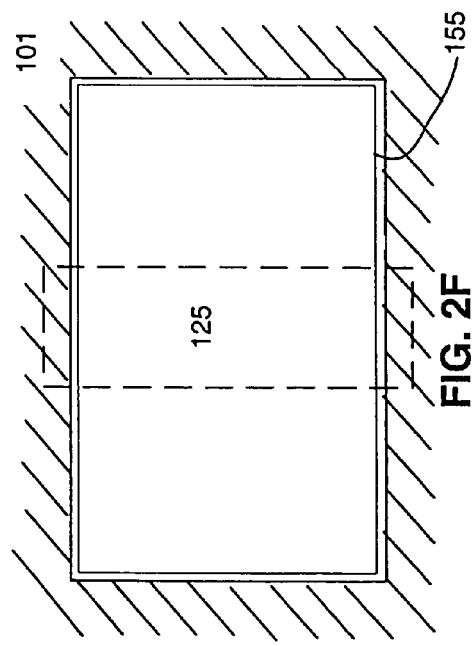
FIG. 2F is a block diagram illustrating a mask used during fabrication of a conventional MOS transistor.
Figure 4:
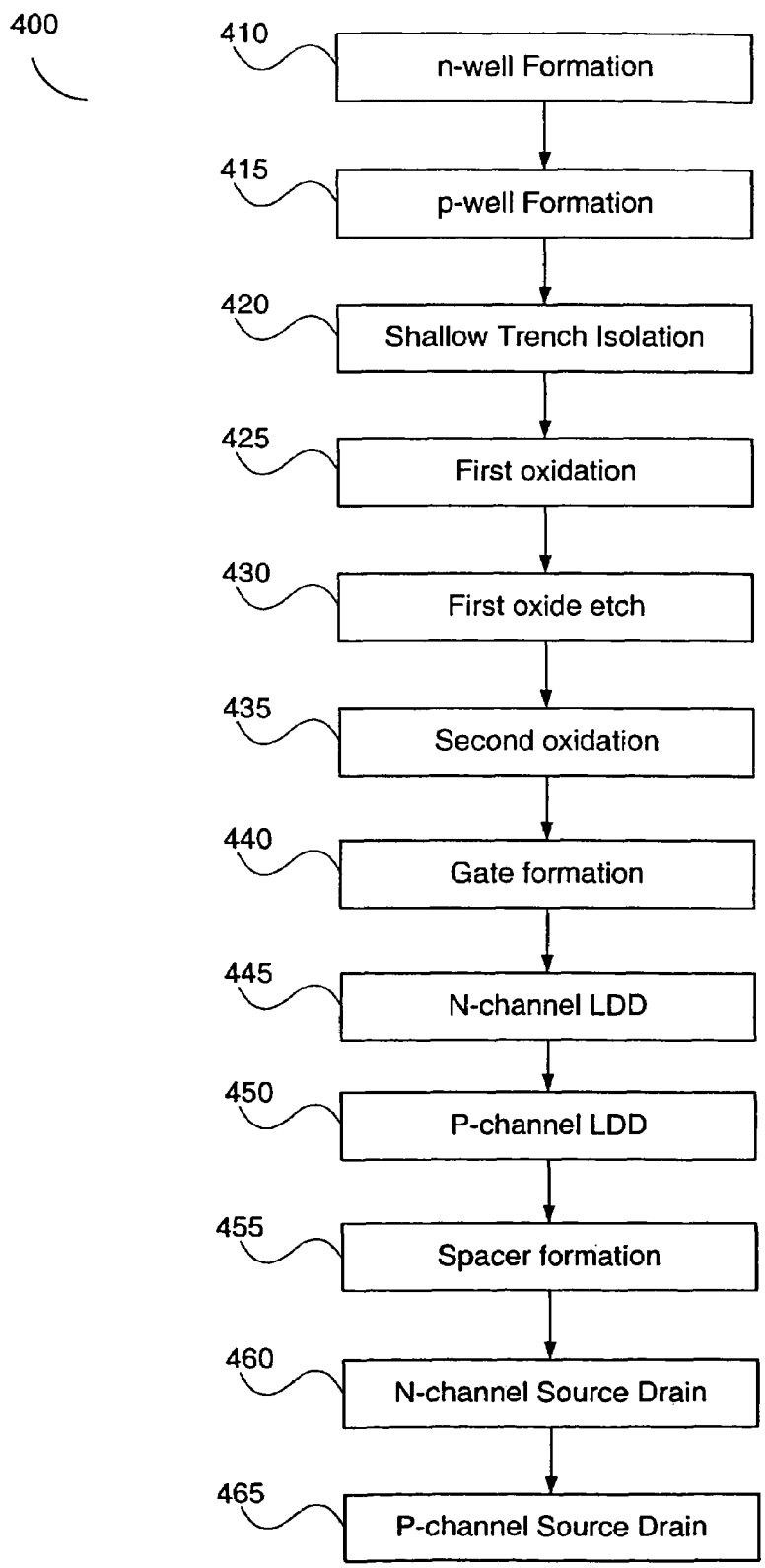
FIG. 4 is a flow chart illustrating part of the processing steps for fabricating an IC according to one embodiment of the present invention.

As another advantage of the present invention, MOS transistor 200 can be fabricated using the same process flow as that used for fabricating prior art transistor 100, with some modification of one or more masks used in fabricating prior art device 100. Thus there is no need for complicated additional processing steps, and no extra process complexity is added to gain the benefit of reduced leakage and enhanced reliability. FIG. 4 illustrates part of a process flow 400 for manufacturing device 200, as part of a CMOS IC, according to one embodiment of the present invention. As shown in FIG. 4, process 400 comprises conventional processing steps associated with n-well formation 410, p-well formation 415, and shallow trench isolation 420. Process 400 further comprises first oxidation processing step 425 for forming a first layer of oxide on substrate 250. The first layer of oxide is part of an oxide layer for high-voltage devices in the CMOS IC, and when it is formed, it covers active areas of most or all of the MOS devices, including device 200, in the CMOS IC. Next, process 400 proceeds to etch away at step 430 some of the first layer of oxide. As shown in FIG. 2F, when fabricating prior art device 100, a low-voltage mask 101 typically exposes all of the active area 155 of device 100, allowing the first oxide layer in area 155 to be etched away. A gate region 125 in FIG. 2F indicates where gate 120 will be formed later for device 100. During the fabrication of device 200 of the present invention, however, as shown in FIG. 3F, a mask 201 is used instead of mask 101. A gate region 225 in FIG. 3F indicates where gate 220 will be formed later in process 400. Mask 201 covers portions of the active area 255 where oxide layers 205 and 206 of device 200 will be located. The length l (as shown in FIG. 3F) of the portions of the active area 255 covered by mask 205 can vary, but it is usually made longer than the length of the gate region 225 to make alignment with gate 220 easy and to help attenuate any implants that will be directed later on toward these delicate portions of the active area. Thus, while the first oxide layer in most of the active area 255 is etched away, a portion of the first oxide layer remains near the ends of the gate region 225 to form oxide layers 205 and 206 of device 200.

Process 400 further comprises a processing step 435 associated with the formation of a second oxide layer using conventional oxidation techniques. The second oxide layer forms oxide layer 210 in device 200. Thus a composite oxide layer comprising oxide layers 210, 205 and 206 is formed. The composite oxide layer is thicker near the ends of gate region 225.

Process 400 further comprises processing steps 440, 445, 450, 455, 460, 465 associated with the formation of gate 220, LDD regions 270 and 275, spacers 290 and 295, and source and drain regions 260 and 265, using conventional semiconductor processing technologies. Gate 220 is formed above the gate region 225.

Although process 400 is preferred, it is noted that other methods can also be used to form the composite gate oxide layer for device 200. For example, the composite oxide layer can be formed by forming a nonuniform first oxide layer followed by a second oxide layer. The first oxide layer is formed by placing a mask (such as a silicon nitride mask) over the substrate, so that the mask covers most part of the active area of device 200, leaving portions of the active area near ends of the gate region 225 exposed to an oxidation ambient. The substrate is then oxidized in the oxidation ambient to form the nonuniform first oxide layer. After the mask is removed, the substrate is further oxidized to form the composite oxide layer on the entire gate region. As another example, the composite oxide layer can also be formed by forming a uniform first oxide layer followed by a nonuniform second oxide layer. The nonuniform second oxide layer is formed by placing a mask over the first oxide layer so that the mask covers most part of the active area of device 200, leaving portions of the active area near ends of the gate region 225 exposed to an oxidation ambient, and the substrate is then further oxidized in the oxidation ambient to form the nonuniform composite oxide layer.

The present invention provides various technical advantages. A technical advantage of the present invention includes the reduction or elimination of off-state leakage currents. Another technical advantage of the present invention includes decreased heat dissipation and power consumption due to leakage currents or from a higher overall $V_t$ that would result from a gate oxide layer having uniform thickness. The present invention also results in increased gate oxide integrity and improved overall system and chip reliability.

Although the present invention has been described in detail, it should be understood that various changes, substitutions, and alterations can be made hereto without departing from the spirit and scope of the invention as defined by the appended claims.

We claim:

1. A transistor fabricated on a semiconductor substrate, comprising:
    a gate over the substrate;
    a source region and a drain region in the substrate on opposite sides of the gate;
    the gate having a length extending in a first direction between the source region and the drain region and a width extending in a second direction transverse to the first direction with first and second ends at opposite ends of the gate in the second direction;
    a composite gate oxide layer under the gate comprising first and second oxide layers, the composite gate oxide layer being thicker on at least one of the first and second ends of the gate; and
    lightly doped drain regions adjacent the source and drain regions wherein doping concentrations in the lightly doped drain regions are lighter near ends of the gate.

2. The transistor of claim 1 wherein the transistor is adjacent to at least two isolation regions in the substrate and the gate extends from one isolation region to another isolation region.

3. The transistor of claim 2 wherein the composite gate oxide is thicker adjacent to the isolation regions.

4. The transistor of claim 1 wherein the first oxide layer is nearly uniform under the gate and the second oxide layer only covers a portion of the first oxide layer under the gate.

5. The transistor of claim 1 further comprising spacers adjacent the gate.

6. The transistor of claim 1 wherein doping concentrations in the source or drain region are lighter near ends of the gate.

7. A transistor fabricated on a semiconductor substrate comprising:
    a first oxide layer on the substrate;
    a second oxide layer on the substrate;
    a gate over the substrate;
    a source region and a drain region in the substrate on opposite sides of the gate; and
    the gate having a length extending in a first direction between the source region and the drain region and a width extending in a second direction transverse to the first direction with first and second ends at opposite ends of the gate in the second direction;
    wherein the first oxide layer and the second oxide layer form a composite oxide layer under the gate, the composite oxide layer being thicker on at least one of the first and second ends of the gate; and
    lightly doped drain regions adjacent the source and drain regions wherein doping concentrations in the lightly doped drain regions are lighter near ends of the gate.

8. The transistor of claim 7 further comprising lightly doped drain regions formed by implanting dopants through the composite oxide layer, wherein the dopants are partially blocked or attenuated during implantation by the thicker composite layer near at least one end of the gate.

9. The transistor of claim 7 wherein the transistor is adjacent to at least two isolation regions in the substrate and the gate extends from one isolation region to another isolation region.

10. The transistor of claim 9 wherein the composite gate oxide is thicker adjacent to the isolation regions.

11. The transistor of claim 7 wherein first oxide layer is nearly uniform under the gate and the second oxide layer only covers a portion of the first oxide layer under the gate.

12. The transistor of claim 7 further comprising spacers adjacent the gate.

13. The transistor of claim 7 wherein doping concentrations in the source or drain region are lighter near ends of the gate.

* * * * *